April 4, 1967 L. J. POLLOCK 3,312,882

TRANSISTOR STRUCTURE AND METHOD OF MAKING, SUITABLE FOR INTEGRATION AND EXHIBITING GOOD POWER HANDLING CAPABILITY AND FREQUENCY RESPONSE

Filed June 25, 1964 3 Sheets-Sheet 1

WITNESSES:

Bernard R. Gieguez

James F. Young

INVENTOR
Larry J. Pollock

BY Gordon H. Telfer

ATTORNEY

April 4, 1967 L. J. POLLOCK 3,312,882

TRANSISTOR STRUCTURE AND METHOD OF MAKING, SUITABLE FOR INTEGRATION AND EXHIBITING GOOD POWER HANDLING CAPABILITY AND FREQUENCY RESPONSE

Filed June 25, 1964 3 Sheets-Sheet 2

April 4, 1967 L. J. POLLOCK 3,312,882
TRANSISTOR STRUCTURE AND METHOD OF MAKING, SUITABLE FOR INTEGRATION AND EXHIBITING GOOD POWER HANDLING CAPABILITY AND FREQUENCY RESPONSE
Filed June 25, 1964 3 Sheets-Sheet 3

United States Patent Office 3,312,882

Patented Apr. 4, 1967

3,312,882

TRANSISTOR STRUCTURE, AND METHOD OF MAKING, SUITABLE FOR INTEGRATION AND EXHIBITING GOOD POWER HANDLING CAPABILITY AND FREQUENCY RESPONSE

Larry J. Pollock, Odenton, Md., assignor to Westinghouse Electric Corporation, East Pittsburgh, Pa., a corporation of Pennsylvania Filed June 25, 1964, Ser. No. 377,978
6 Claims. (Cl. 317—235)

This invention relates generally to semiconductor devices and, more particularly, to transistor structures that may be included within integrated circuits incorporating other functional structures in a unitary body of semiconductive material.

In the art of integrated circuitry whereby the functions of the plurality of individual conventionally interconnected components are provided within a unitary body of semiconductive material, considerable success has been previously achieved in the provision of low power devices, such as transistors, as are used in small signal amplifiers and logic elements. Considerable demand exists, however, for transistor structures capable of delivering high power, low duty cycle output pulses.

It is of course possible to achieve improvement in power handling capability merely by increasing the size of the structure, particularly the junction areas. However, specific means to achieve greater power handling capability per unit of device area are still needed because the area, or volume, of semiconductive material available for a single transistor in an integrated circuit is limited, as a practical matter, to less than roughly 0.01 inch square.

The necessary and desired properties of a power transistor structure include, besides high power handling capability per unit area, a low saturation resistance, high breakdown voltage of the collector junction, high emitter efficiency at high current in a structure that is compatible with existing fabrication techniques for integrated circuits and permits simultaneous fabrication of other elements in other portions of the semiconductive body, that are electrically isolated from the power transistor.

It is, therefore, an object of the present invention to provide an improved transistor structure, particularly for use in integrated circuits, that has improved power handling capability per unit area with good frequency response.

Another object is to provide a power transistor structure for integrated circuits characterized by small size, low saturation resistance, high breakdown voltage of the collector junction and high emitter efficiency at high current.

Another object is to provide an improved method for the fabrication of transistor structures in integrated circuits that is compatible with presently employed techniques used for the fabrication of other elemental structures and that results in a structure having increased power handling capability per unit area and improved frequency response.

The present invention, in brief, achieves the above-mentioned and additional objects and advantages in a structure of collector, base and emitter regions comprising the following elements. The collector includes a first portion of high resistivity material and a second portion of considerably lower resistivity material that encloses the high resistivity material. The base region forms a base-collector junction with the relatively high resistivity material portion of the collector so as to provide a relatively high breakdown voltage. The low resistivity portion of the collector provides a low saturation resistance. The base region of the structure, of material of opposite semiconductivity type to that of the collector region, also comprises two portions including a high resistivity portion and a low resistivity portion. The high resistivity portion occurs at the emitter-base junction while the low resistivity portion occurs in a matrix configuration that laterally encloses the high resistivity portion. The base contact is disposed on the low resistivity portion of the base region. The collector contact is made to the low resistivity portion of the collector region. The emitter of the structure is disposed within the relatively high resistivity portion of the base region so as to evenly distribute current and prevent hot spots. The emitter contact and base contact are disposed as a plurality of interleaved finger-like portions providing what is commonly referred to as an interdigitated configuration.

This structure achieves a very high emitter edge to collector area ratio giving an excellent power per unit area figure and allowing high instantaneous power, low duty cycle devices in a small volume.

The method of the present invention is significantly advantageous in that it not only achieves structures providing the foregoing advantages but it is compatible with existing integrated circuit fabrication techniques and permits the fabrication in other parts of the unitary body of structures providing resistor, capacitor, diode, field effect transistor and conventional transistor functions. The method generally comprises the steps of selectively diffusing into a substrate of a first semiconductivity type a region of a second semiconductivity type. For the purposes of example, the substrate will be assumed to be of p-type semiconductivity and the first selectively diffused region of n-type semiconductivity. Next, an n-type epitaxial layer is grown over the substrate surface in which the first selectively diffused region, sometimes referred to as the subdiffused region, is disposed. The n-type epitaxial layer has a significantly higher resistivity than the subdiffused region. A p-type impurity is selectively diffused through the epitaxial layer forming a p-type wall that extends to the substrate and isolates a portion of the n-type epitaxial layer and, in the same selective diffusion, a p-type matrix, conveniently a pattern of perpendicular lines that extends from the surface of the epitaxial layer to the underlying n-type diffused region, is formed in the n-type layer that is enclosed by the p-type wall. Subsequently, an n-type impurity is diffused into the epitaxial layer to form a wall extending around the periphery of the subdiffused region and joining thereto to complete the low resistivity portion of the collector region. A selective diffusion of a p-type impurity is then performed over the subdiffused region and directly into the matrix of p-type material to form the higher resistivity portion of the transistor base region. A plurality of individual regions are formed by selective diffusion of an n-type impurity within the higher resistivity portion of the base region. Contacts are then formed to the collector wall, to the low resistivity portion of the base region and to the individual emitter regions.

The foregoing and additional objects and advantages of the invention will become clearer by referring to the following description together with the accompanying drawing, wherein.

Figure 2:
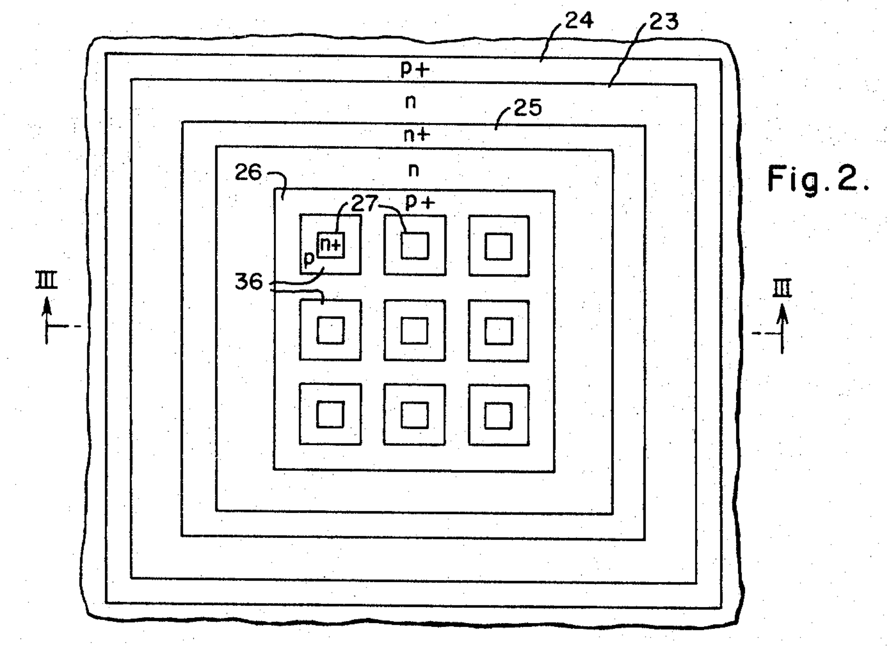
FIG. 2 is a plan view of a portion of an integrated circuit illustrating a transistor structure in accordance with the present invention.
Figure 3:
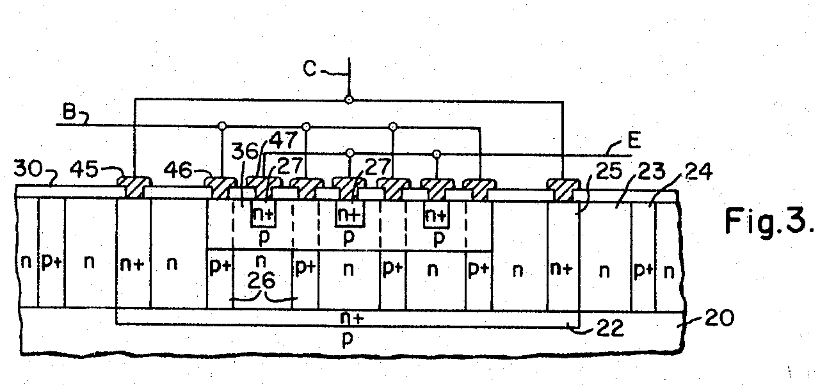
FIG. 3 is a partial sectional view taken along the line III—III of FIG. 2 and in addition illustrating contacts to the semiconductive material with a schematic illustration of the interconnection of said contacts and also illustrating the surface passivating layer on the integrated circuit.
Figure 5:
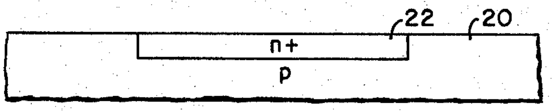
Figure 6:
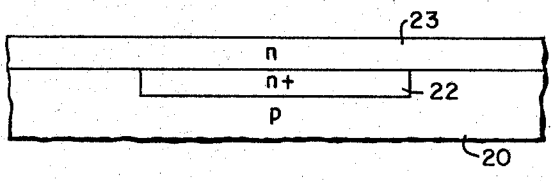
Figure 7:
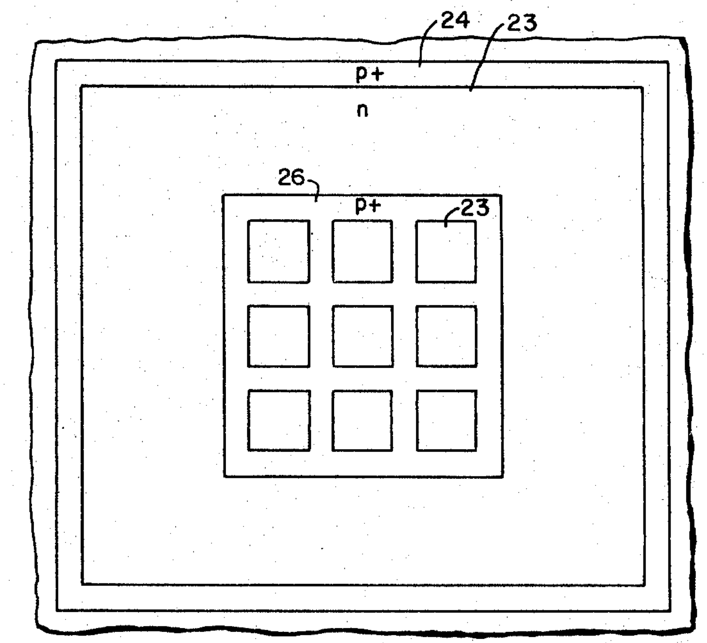
Figure 11:
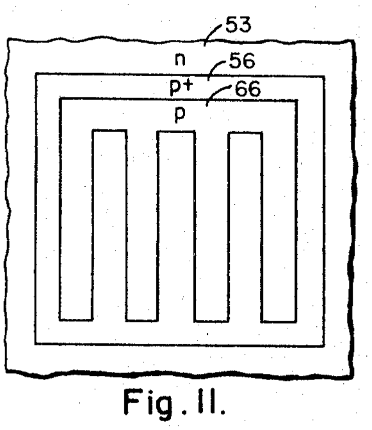
Figure 12:
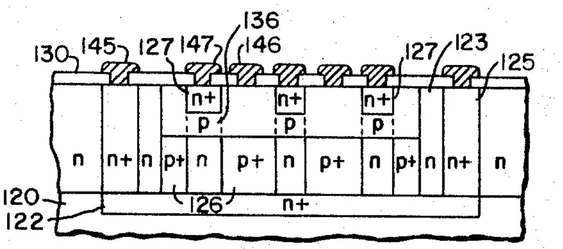

FIGS. 5 through 10 illustrate successive stages in the practice of the method in accordance with the present invention that results in the structure as illustrated in FIGS. 2 and 3 wherein FIGS. 5, 6, and 8 and 10 are sectional views and FIG. 7 is a plan view;

FIG. 11 is a partial plan view of an alternative configuration in accordance with the present invention; and FIG. 12 is a partial sectional view illustrating additional alternatives in accordance with the present invention.

Figure 1:
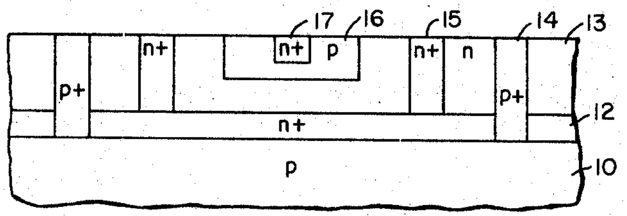
PRIOR ART Fig. 1.
FIGURE 1 is a cross-sectional view of a part of an integrated circuit illustrating a transistor structure in accordance with the prior art.

Referring now to FIG. 1, a transistor structure is illustrated that has many desirable features but its power handling capability is not satisfactory for some purposes. On a p-type substrate 10, n+ and n-type layers 12 and 13, respectively, are disposed. The n+ material has a lower resistivity by at least about an order of magnitude than the n material. In accordance with known techniques, the layers 12 and 13 may be epitaxially grown on the substrate 10. Alternatively, the n+ layer 12 may be formed by the diffusion of a donor impurity such as arsenic into the surface of the substrate with the layer 13 then being epitaxially grown over the diffused layer. A p-isolation wall 14 is diffused through both epitaxial layers to the substrate and an n+ collector wall 15 extends from the surface to the n+ layer 12.

The p-type base region 16 is diffused into the n-type layer 13. Subsequently, the n+ type emitter 17 is diffused into the base region 16. For further information with respect to transistor structures within integrated circuits of the type illustrated in FIG. 1, reference may be made to copending application Serial No. 353,524, filed March 20, 1964, by J. D. Husher and L. J. Pollock and assigned to the assignee of the present invention.

Figure 4:
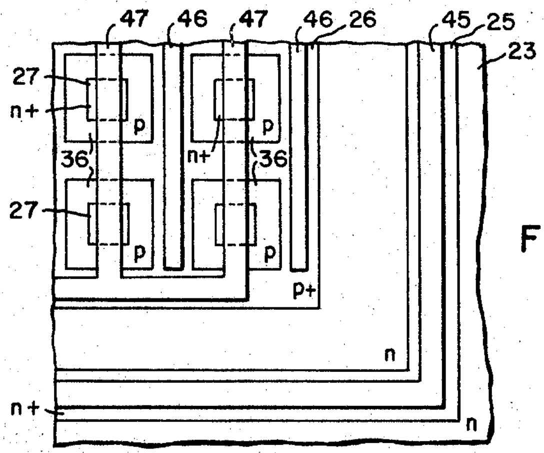
FIG. 4 is an enlarged partial view of the structure of FIG. 2 further illustrating the contacts to the integrated structure.

Referring now to FIGS. 2, 3 and 4, a structure in accordance with the present invention is illustrated comprising a p-type substrate 20 with an n+ region 22 therein and an n-type epitaxial layer 23 disposed over the surface having the n+ region 22. A p+ type isolation wall 24 encloses a portion of the n type epitaxial layer 23 over the n+ region 22 and an n+ collector contact wall 25 extends from the surface of the device to the underlying n+ region 22. Within the enclosed portion of the n-type epitaxial layer 23 there is a p-type region including a first portion 26 of relatively low resistivity (p+) that is disposed in a matrix-like configuration having a plurality of openings therein and a second high resistivity portion 36 (p) that is within the openings in the matrix 26. The resistivity of portion 26 is at least an order of magnitude less than that of portion 36. Within the portion 36 are a plurality of individual n+ type regions 27 that provide the emitter of the transistor structure.

FIGS. 3 and 4 illustrate the manner in which ohmic contacts are disposed on the semiconductive structure. A collector contact 45 is disposed on the surface of the n+ wall 25. A base contact 46 and emitter contact 47 are disposed in an interdigitated configuration. The base contact 46 forms a low resistance contact with the p+ matrix portion 26 of the base region. The emitter contact 47 makes ohmic contact with each of the individual emitter regions 27 and extends over an insulating layer such as a surface passivating layer 30 of silicon dioxide between the individual emitter regions 27. For clarity in illustration, the contacts 45, 46 and 47 have not been shown in FIG. 2 and surface passivating layer 30 is shown only in FIG. 3.

The structure will be more particularly described in connection with FIGS. 5 to 10 which illustrate successive stages in the fabrication process for the structure of FIGS. 1, 2 and 3 and employ the same reference numerals to indicate like elements.

FIG. 5 shows the substrate 20 of p-type semiconductivity after there has been selectively diffused on a major surface thereof an n+ region 22 to a low sheet resistivity, typically of about 25 ohms per square. This first selective diffusion operation, as well as others to be described, is conveniently performed by using known oxide masking techniques.

FIG. 6 shows the structure after there has been formed by epitaxial growth an n-type layer 23 over the major surface of the substrate 20 on which the n+ type region 22 is disposed. The n-type epitaxial layer 23 is grown to a thickness sufficient to avoid the effects of out-diffusing impurities from the diffused region, such thickness conveniently being about 10 to 15 microns with a typical resistivity of about 0.5 ohm-centimeter.

In the plan view of FIG. 7, the structure is shown after there has been formed by selective diffusion into the exposed surface of the epitaxial layer 23 p-type regions including a p+ wall 24 isolating a portion of the n-type epitaxial layer 23 and a p+ matrix 26 of perpendicular lines leaving undiffused squares of material of epitaxial layer 23 directly above the subdiffused region 22. This diffusion is carried out to the extent that the p-type impurities penetrate through the epitaxial layer so that the p+ wall 24 extends to the substrate and the matrix 26 of diffused lines extends to the subdiffused region 22 but does not penetrate therethrough. The sheet resistivity of the regions 24 and 26 is typically about 5 ohms per square.

Figure 8:
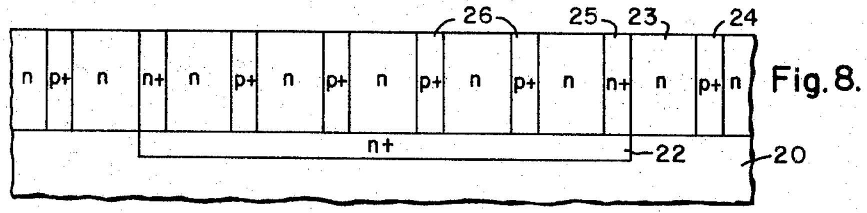

Next, as shown in FIG. 8, an n-type impurity is selectively diffused to form the n+ collector wall 25 that extends to the subdiffused region 22. The sheet resistivity of the collector wall 25 is typically about 3 ohms per square.

Figure 9:
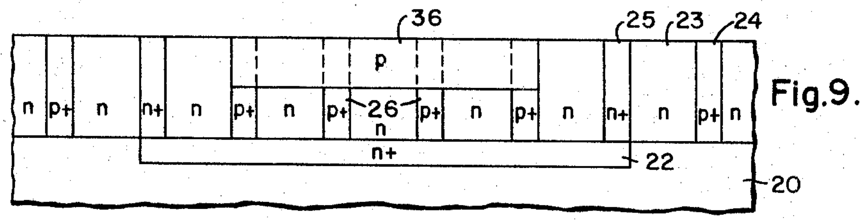

In FIG. 9, another selective diffusion with a p-type impurity has been performed to form a surface layer 36 over the previously diffused p-type matrix 26. The sheet resistivity of the portion of the region 36 that is enclosed by the matrix 26 is typically about 150 ohms per square.

Figure 10:
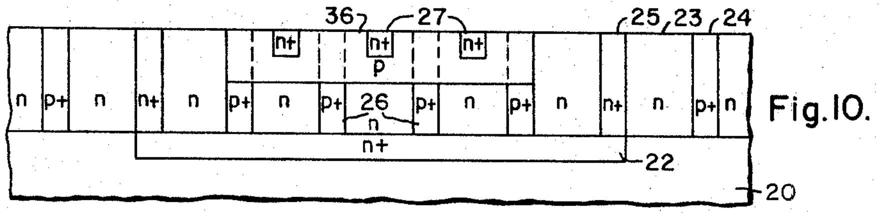

FIG. 10 illustrates the structure after a plurality of n+ regions 27 have been selectively diffused within the openings in the matrix 26 to form a multiple emitter structure. The sheet resistivity of the regions 27 is typically about 3 ohms per square.

In subsequent operations, the contacts as illustrated in FIGS. 3 and 4 are formed by conventional techniques.

The described method in accordance with this invention is particularly advantageous in that it requires no extra impurity diffusion operations. For example, highly doped portion 26 of the base region is formed simultaneously with the formation of isolation walls, such as 24, throughout the device. The less doped portion 36 of the base region can be formed simultaneously with the formation of conventional diffused resistive regions, diode anodes or transistor bases elsewhere in the structure. Consequently, the structure is not subjected to additional heating with the problems attendant thereto.

In the discussion herein concerning diffusion operations, it will be understood that a two step operation may be performed wherein the impurity material is first deposited in a shallow surface layer on the semiconductive material and then is driven or redistributed in the semiconductive material as may be practiced with gaseous impurity sources such as phosphene, arsene and borane. The redistribution of impurities to form a region such as portion 26 of the base may not be complete to the regions 22 until a later heating cycle such as for the redistribution of impurities to form portion 36 of the base.

The present invention may be conveniently carried out as described with silicon as the semiconductive material although the invention extends to the use of other semiconductive materials. The various regions of the example structures may be of opposite semiconductivity type to that specifically shown and described. Phosphorus and boron may conveniently be employed by known techniques as the donor and acceptor impurities although the invention is not limited thereto.

A structure as illustrated and described has been made, in an integrated circuit, with emitters in a 7 by 7 matrix with the base region 36 having dimensions of 19 by 19 mils. The transistor structure exhibited no fall-off in current gain up to 1 ampere that compares with typical performance of 2N2297 transistors. Power handling capability of this structure was 35 watts.

Besides improved power handling capability, devices in accordance with this invention have improved high frequency performance. That is, $f_t$, the frequency at which gain drops to unity, corresponds favorably with that of prior structures. The structure just described had an $f_t$ of 450 mc. at 10 ma. and 600 mc. at 100 ma. The base resistance, $r_b'$, between the base contact and the emitter junction is minimized by the highly doped portion of the base. Furthermore, lateral injection from the emitter, that is ineffective at high frequencies, is not as large a factor at low frequencies since the highly doped portion at the base makes the sides of the emitter have a low injection efficiency. Consequently, structures in accordance with the present invention are desirable as individual component transistors as well as in integrated circuits.

Variations in geometry are possible within the scope of this invention so long as the transistor base region has two portions of which one encloses the other and has a resistivity of at least an order of magnitude less than the other. FIG. 11 illustrates such an alternative geometry prior to emitter diffusion or contacting. The p+ portion 56 and p portion 66 of the base correspond in function to portions 26 and 36, respectively of FIG. 2. The emitter would be diffused in the portion 66 and interdigitated contacts formed on the emitter and portion 56. The material n-type region 53 corresponds to that of region 23 of FIG. 2.

The structure of FIG. 12 is similar to that of FIG. 3 and reference numerals having the same last two digits are used to designate corresponding elements. Here the emitter elements 127 and the highly doped portion 126 of the base region are in direct contact at the sides of the emitter to further minimize lateral carrier injection and, hence, improve the frequency response. The total surface area required can also be minimized in this way and also by not having base contact 146 extend on all sides of the emitter. The low resistance of base portion 126 makes it unnecessary to have the emitter region completely surrounded by the base contact.

While the present invention has been shown and described in a few forms only, it will be understood that various changes and modifications may be made without departing from the spirit and scope thereof.

What is claimed is:

1. A transistor structure suitable for incorporation within an integrated circuit comprising: emitter, base and collector regions of which said base region is of opposite semiconductivity type to said emitter and collector regions forming junctions therewith that terminate at a planar surface; said base region comprising first and second portions of which said first portion has a resistivity at least an order of magnitude less than that of said second portion, said first portion having a plurality of integrally joined segments enclosing said second portion in directions parallel with said surface to define a plurality of segments within said second portion at least partially separated by said first portion, said first portion also extending a greater distance from said surface than said second portion; said emitter region being disposed in said second portion of said base region and also having a plurality of segments at least partially separated by said first portion of said base region; ohmic contacts to each of said emitter, base and collector regions, said base contact being disposed only on said first portion of said base region.

2. The subject matter of claim 1 wherein: said collector region comprises a first portion spaced from said second portion of said base region that has a resistivity at least an order of magnitude less than that of a second portion of said collector region adjacent said second portion of said base region.

3. The subject matter of claim 2 wherein: said structure is in an integrated circuit comprising a substrate of the same semiconductivity type as said base region spaced therefrom by said collector region; material of the same semiconductivity type as said second portion of said collector region is disposed in a plurality of zones united by said substrate, said zones being separated by walls of material of the same semiconductivity type as said first portion of said base region.

4. A semiconductor device structure suitable for incorporation within an integrated circuit and capable of handling relatively large amounts of power per unit of device area with good performance at high frequencies comprising: a substrate of a first semiconductivity type; a layer of a second semiconductivity type disposed on said substrate and forming a rectifying junction therewith said layer having a planar surface; means to isolate electrically a portion of said layer from the remainder thereof; a first region of said second semiconductivity type disposed between said substrate and said portion of said layer, said region having a resistivity at least an order of magnitude lower than that of said layer; a second region of said first semiconductivity type disposed in said portion of said layer and comprising a first portion in a configuration of intersecting walls that extend through said layer to said first region and a second portion that is enclosed by said first portion in directions parallel with said substrate surface and terminates within said layer, said first portion having a resistivity at least an order of magnitude less than that of said second portion; a plurality of regions of said second semiconductivity type each disposed in material of said second portion of said second region; means to make electrical contact to said plurality of regions in common and means to make electrical contact to said first portion of said second region.

5. A method of fabricating a transistor structure in an integrated circuit, the steps including: performing a first diffusion of a first type impurity through a layer of second type semiconductivity disposed on a first type semiconductivity substrate in an isolation pattern that separates portions of said layer and simultaneously forming a first region in at least one of said layer portions in a pattern leaving sub-portions of said layer undiffused and enclosed in directions parallel to the plane of the major surfaces of said layer; performing a second diffusion of a first type impurity in said first region and in said subportions to form a second region, said second diffusion being performed to a lesser depth and impurity concentration than said first diffusion; performing a third diffusion of a second type impurity into portions of said second region diffused during said second diffusion and not diffused during said first diffusion to form a segmented emitter region and applying ohmic contacts to said segmented emitter region and to said first region in an interdigitated configuration.

6. A semiconductor transistor structure suitable for incorporation within an integrated circuit comprising: a substrate of a first semiconductivity type; a collector region of a second type of semiconductivity disposed on said substrate and including a first portion and a second portion having a lower resistivity than said first portion, with said second portion enclosing said first portion; a base region of said first type of semiconductivity and including a first portion and a second portion having a lower resistivity than said first portion, said second portion disposed in a matrix configuration extending to said first portion of said collector region and enclosing a plurality of separate parts of said first portion of said base region; an emitter region of said second semiconductivity type disposed in material of said first portion of said base region; a collector contact disposed on said second portion of said collector region; a base contact disposed on said second portion of said base region; and an emitter contact disposed on said emitter region; said base contact and said emitter contact being in an interdigitated configuration.

References Cited by the Examiner

UNITED STATES PATENTS

| | | | |
|---|---|---|---|
| 2,778,980 | 1/1957 | Hall | 317—235 |
| 2,849,665 | 8/1958 | Boyer et al. | 317—235 |
| 3,044,147 | 7/1962 | Armstrong | 317—235 |
| 3,150,299 | 9/1964 | Noyce | 317—234 |
| 3,180,766 | 4/1965 | Williams | 317—235 X |
| 3,183,128 | 5/1965 | Leistiko et al. | 317—235 |
| 3,191,070 | 6/1965 | Jones et al. | 317—235 |
| 3,197,681 | 7/1965 | Broussard | 317—235 |
| 3,197,710 | 7/1965 | Lin | 317—235 |
| 3,229,119 | 1/1966 | Bohn et al. | 317—235 X |
| 3,237,062 | 2/1966 | Murphy | 317—234 |

JOHN W. HUCKERT, *Primary Examiner.*

A. M. LESNIAK, *Assistant Examiner.*

Notice of Adverse Decision in Interference

In Interference No. 96,107 involving Patent No. 3,312,882, L. J. Pollock, TRANSISTOR STRUCTURE, AND METHOD OF MAKING SUITABLE FOR INTEGRATION AND EXHIBITING GOOD POWER HANDLING CAPABILITY AND FREQUENCY RESPONSE, final judgment adverse to the patentee was rendered June 21, 1968, as to claims 1 and 2.

[*Official Gazette August 20, 1968.*]